(12) United States Patent
Miyamoto

(10) Patent No.: US 6,300,667 B1
(45) Date of Patent: *Oct. 9, 2001

(54) SEMICONDUCTOR STRUCTURE WITH AIR GAPS FORMED BETWEEN METAL LEADS

(75) Inventor: Yasushi Miyamoto, Tokyo (JP)

(73) Assignee: Nippon Steel Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/137,772

(22) Filed: Aug. 25, 1998

(30) Foreign Application Priority Data

Nov. 14, 1997 (JP) ................................................ 9-330881

(51) Int. Cl.⁷ .............................. H01L 29/00; H01L 23/58

(52) U.S. Cl. .................... 257/522; 257/640; 257/641; 257/644; 257/649; 257/650

(58) Field of Search ..................................... 257/522, 758, 257/760, 632, 640, 641, 644, 649, 650; 438/319, 411, 619

(56) References Cited

U.S. PATENT DOCUMENTS

| | | | |
|---|---|---|---|
| 5,310,700 | * | 5/1994 | Lien et al. ............................ 437/195 |
| 5,512,775 | * | 4/1996 | Cho ....................................... 257/522 |
| 5,641,712 | * | 6/1997 | Grivna et al. ........................ 438/624 |
| 5,668,398 | * | 9/1997 | Havemann et al. ................. 257/522 |
| 5,814,888 | * | 9/1998 | Nishioka et al. ..................... 257/758 |
| 5,861,674 | * | 1/1999 | Ishikawa ............................... 257/758 |
| 5,869,880 | * | 2/1999 | Grill et al. ............................ 257/522 |
| 5,923,074 | * | 7/1999 | Jeng ..................................... 257/522 |
| 5,955,786 | * | 9/1999 | Avanzino et al. ................... 257/758 |

FOREIGN PATENT DOCUMENTS

| | | |
|---|---|---|
| A-7-45701 | 2/1995 | (JP) . |
| A-9-129726 | 5/1997 | (JP) . |
| A-9-172068 | 6/1997 | (JP) . |
| A-9-186232 | 7/1997 | (JP) . |

OTHER PUBLICATIONS

Machida et al., Novel Global Planarization Technology for Interlayer Dielectrics, The Japan Society of Applied Physics and Related Societies, Mar., 1997, Cat. No. AP 971106–02.

* cited by examiner

Primary Examiner—Minh Loan Tran
(74) Attorney, Agent, or Firm—Connolly Bove Lodge & Hutz

(57) ABSTRACT

A semiconductor device is fabricated first by thermocompression-bonding a silicon oxide film onto a plurality of conductive films under vacuum using a film having the silicon oxide film formed thereon and then by separating the base film from the silicon oxide film. During the separation, the base film, being composed of a fluorine-containing resin, has smaller surface energy than a silicon oxide film and thus is easy to separate, leaving the silicon oxide film on the conductive films. As a result, the silicon oxide film is adhered on the conductive films so as to cover the conductive films, and an air gap is hence provided between the conductive films. Thus, a highly reliable semiconductor device capable of high-speed operation is provided by controlling parasitic capacitances between interconnections arranged accurately and adequately adjacent to each other so that recent needs for further miniaturization and higher integration of semiconductor elements can be met.

9 Claims, 7 Drawing Sheets

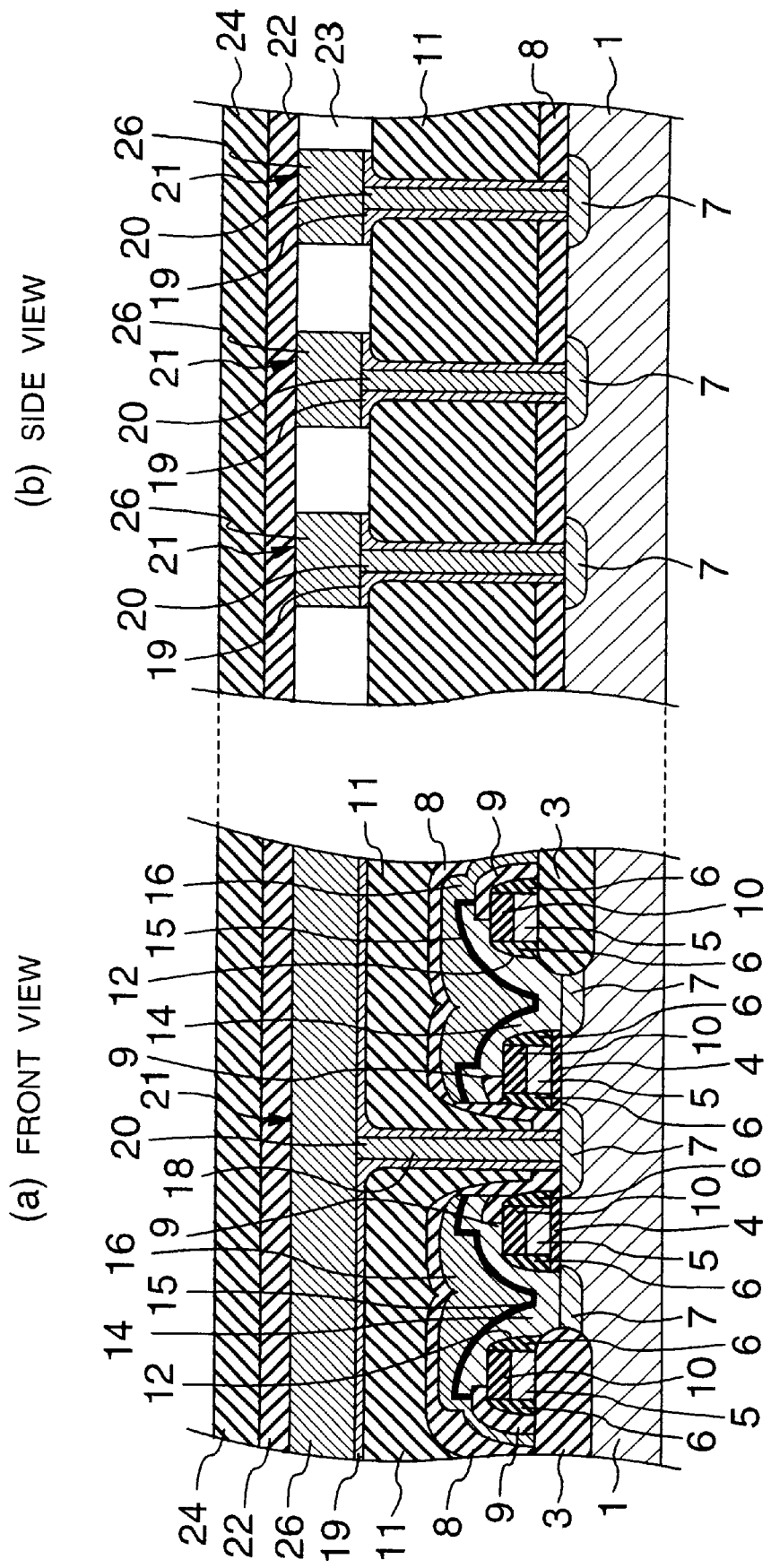

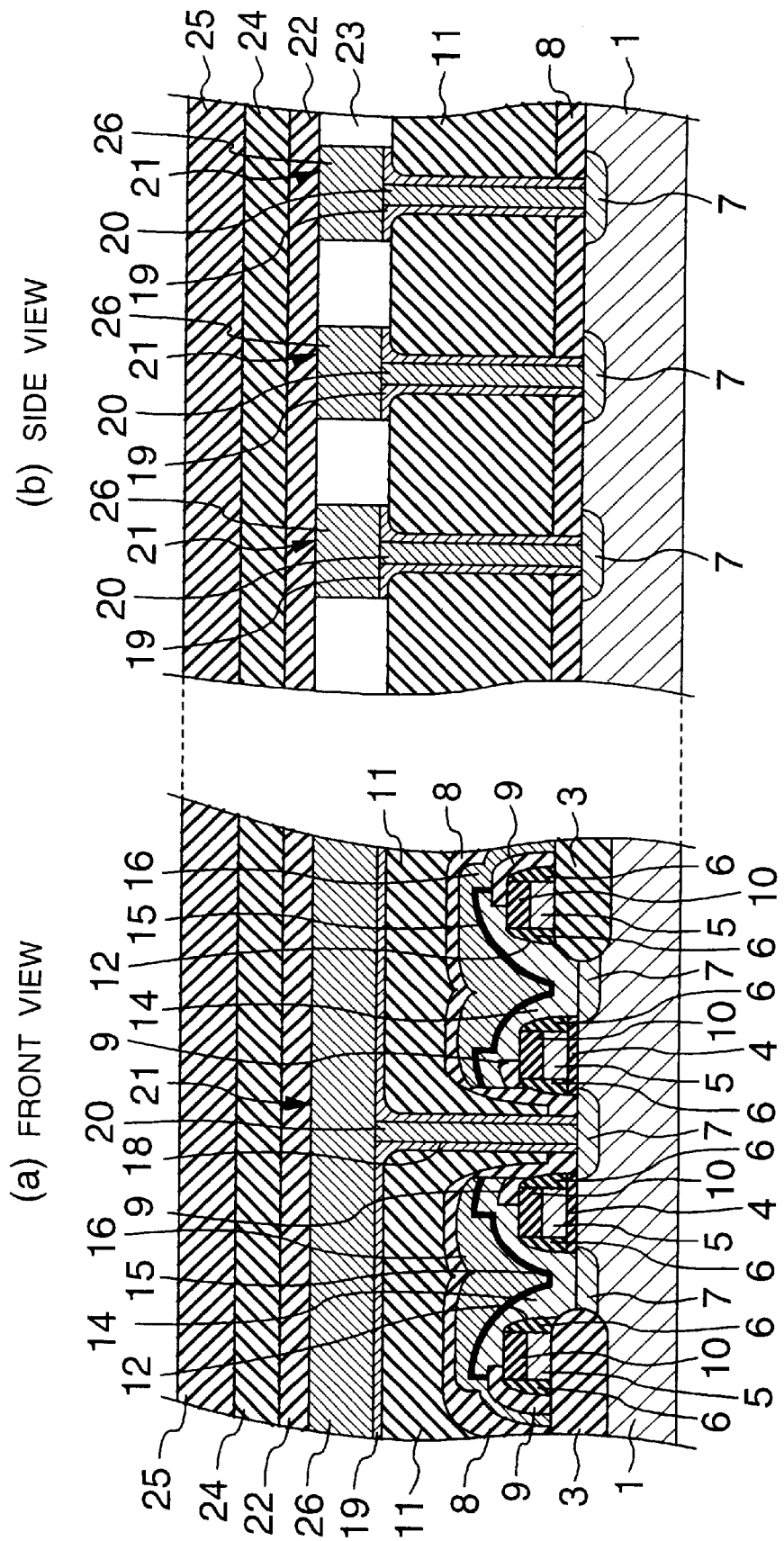

SEMICONDUCTOR STRUCTURE WITH AIR GAPS FORMED BETWEEN METAL LEADS

BACKGROUND OF THE INVENTION

1. Field of the Invention

The present invention relates to a semiconductor device and a method of fabricating such semiconductor device. The invention is particularly well adapted for semiconductor devices having various interconnection wiring layers, such as logic LSIs and DRAMs.

2. Description of the Related Art

In association with recent trend towards the miniaturization and higher integration of semiconductor elements, the distance between a plurality of adjacent interconnection runners is reduced, and this has imposed the problem of increased RC (resistance and capacitance) delay in interconnections caused by increased parasitic capacitance between interconnection runners. To reduce the parasitic capacitances between interconnections most effectively, attempts have been made to provide an air gap between a plurality of interconnection runners arranged on a single layer.

For example, JP-A-7-45701 discloses a method of fabricating a semiconductor device involving the steps of forming a plurality of interconnections on a single layer, forming a solid film (ice) by cooling with a liquid; removing the solid film until the interconnection portions are exposed, forming a coarse insulating film having a large shrinking rate, evaporating the solid film through the coarse insulating film by vaporizing the solid film by heat or the like, and forming a dense insulating film having a shrinking rate which is smaller than that of the coarse insulating film. This method provides the air gap between interconnections, but brings about, at the same time, a fear that the residual moisture will corrode the interconnections.

Similarly, JP-A-9-172068 discloses a fabrication method using an organic resin film as the solid film in place of ice and using an organic SOG (spin on glass) as the coarse insulating film and involving the step of removing the organic resin film through the organic SOG film by means of an $O_2$ plasma process or the like. However, it is extremely difficult to remove the organic resin film completely.

Further, JP-A-9-129726 discloses a semiconductor device of a multilevel metallization (wiring) structure in which first and second interconnection wiring layers formed over the first interconnection wiring layers are arranged on a semiconductor substrate. The structural feature of this semiconductor device is such that a vacuum or a gas such as air is present between a plurality of the first interconnection wiring layers arranged on a single layer. To fabricate this semiconductor device, an interlayer insulating film composed of a polyimide film is adhered onto the first interconnection wiring layers, and then etched using a photoresist as a mask to form throughholes. Then, a tungsten plug is formed within each throughhole. Thereafter, an aluminum alloy film is deposited on the resultant, and then etched using a photoresist as a mask to form the second interconnection wiring layers. This fabrication method also provides an air gap between interconnection wiring layers, but still imposes problems since the polyimide film is less heat-resistant and degasses in large amounts. In addition, the polyimide film must have a certain thickness to be adhered onto the first interconnection wiring layers.

Furthermore, JP-A-9-186232 discloses a method of fabricating a semiconductor device involving the steps of forming a first interlayer insulating film on the surfaces of first interconnection wiring layers formed on a semiconductor substrate, forming a second interlayer insulating film so as to bury recesses formed in the first interlayer insulating film, forming a third interlayer insulating film that is deposited on both the first and second interlayer insulating films, and forming cavities in the recesses first by etching the third interlayer insulating film using a throughhole-patterned masking resist and then by etching the second interlayer insulating film exposed by the preceding etching process to thereby remove the second interlayer insulating film buried in the recesses. However, an air gap cannot be provided in all the spaces between the first interconnection wiring layers since the first interlayer insulating film remains on the first interconnection wiring layers.

SUMMARY OF THE INVENTION

The object of the present invention is, therefore, to provide a highly reliable semiconductor device capable of high-speed operation by easily and reliably controlling parasitic capacitances between interconnection metal lines arranged accurately and adequately adjacent to each other so that recent needs for further miniaturization and higher integration of semiconductor elements can be met.

To achieve the above object, a first aspect of the invention provides a semiconductor device that comprises a semiconductor substrate; a plurality of conductive films formed over the semiconductor substrate; an insulating film adhered onto the plurality of conductive films so as to cover the plurality of conductive films, an air gap being provided between the plurality of conductive films so that the plurality of conductive films are insulated through the air gap; and a nitride film formed on the insulating film.

Further, a second aspect of the invention provides a semiconductor device that comprises a semiconductor substrate; a plurality of conductive films formed over the semiconductor substrate; an insulating film adhered onto the plurality of conductive films so as to cover the plurality of conductive films, an air gap being provided between the plurality of conductive films so that the plurality of conductive films are insulated through the air gap, the insulating film including a film selected from the group consisting of a TEOS (tetra ethoxy silane) plasma silicon oxide film, a silicon nitride film and a BPSG (boro-phospho silicate glass) film.

Still further, a method of fabricating a semiconductor device according to the present invention comprises the steps of forming an interlayer insulating film over a semiconductor substrate; forming a plurality of conductive films on the interlayer insulating film; forming a first insulating film on a base film; bonding the first insulating film onto the plurality of conductive films together with the film so as to maintain an air gap between the plurality of conductive films; and leaving only the first insulating film on the plurality of conductive films by separating the base film from the first insulating film.

According to the method of fabricating a semiconductor device of the invention, the first insulating film is adhered onto the plurality of conductive films (interconnection wiring layers) patterned on the interlayer insulating film or the like by pressing such as thermocompression bonding or the like using the film that has the first insulating film arranged on its surface. During the deposition, the first insulating film is formed so as to cover only the upper surfaces of the interconnection wiring layers, so that the material of the first insulating film does not enter into the space between interconnection metal lines and hence an air gap is provided between adjacent interconnection metal lines. Since the first insulating film is formed on the interconnection layers by pressing, the air gap is provided in the space between the interconnection metal lines easily and reliably to ensure sufficient insulation between the interconnections even if the interconnection wiring layers become further miniaturized in size and extremely complicated in shape.

BRIEF DESCRIPTION OF THE DRAWINGS

FIGS. 1A to 1J are sectional views showing a method of fabricating a semiconductor device according to an embodiment of the present invention, in the order of process steps; a FIG. 2 is a sectional view showing a semiconductor device according to another embodiment of the present invention.

DESCRIPTION OF THE PREFERRED EMBODIMENTS

Semiconductor devices and methods of fabricating such semiconductor devices according to embodiments of the present invention will be described in detail with reference to the drawings. Exemplified as semiconductor devices in these embodiments are DRAMs in which a memory cell includes an access transistor and a memory capacitor, and the structure of such DRAMs will be described together with their fabrication methods.

FIGS. 1A to 1J are schematic sectional views showing a method of fabricating a DRAM according to an embodiment of the present invention, in the order of process steps.

Figure 1A:
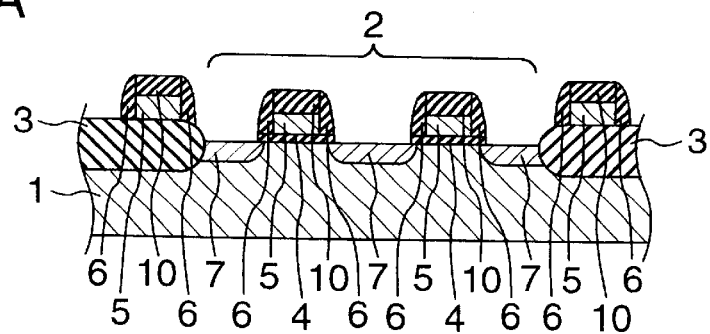

First, as shown in FIG. 1A, an element-forming region 2 is defined on a p-type silicon semiconductor substrate 1 by forming a field oxide film 3 as a device isolation structure using a so-called LOCOS method. The field oxide film 3 may be replaced with a field shield device isolation structure formed by a field shield device isolation method. In this structure, a conductive film is buried in an insulating film, and element separation is achieved by fixing a silicon semiconductor substrate portion immediately below the conductive film to a predetermined potential through the conductive film.

Then, a silicon oxide film is formed by thermally oxidizing the silicon semiconductor substrate 1 surface in the element-forming regions 2 that are separated from each other and relatively defined by the field oxide film 3. Then, a polysilicon film doped with impurities by a CVD (chemical vapor deposition) method is deposited on the silicon oxide film, and a silicon oxide film is further deposited on the polysilicon film in succession.

Then, the silicon oxide film, the polysilicon film and the silicon oxide film are patterned by photolithography and subsequent dry etching to form a gate oxide film 4, a gate electrode 5, and a cap insulating film 10 by leaving the silicon oxide film, the polysilicon film and the silicon oxide film on the element-forming region 2 in the form of an electrode.

Then, after removing the photoresist used for the patterning by ashing, a silicon oxide film is deposited on the entire surface of the resultant including the cap insulating film 10 by the CVD method, and the entire surface of the silicon oxide film is then subjected to an anisotropic etching process to leave the silicon oxide film only on the side surfaces of the gate oxide film 4, the gate electrode 5 and the cap insulating film 10. Thus, sidewalls 6 are formed.

Successively, impurities are added to the silicon semiconductor substrate 1 surface on both sides of the gate electrode 5 through ion implantation using the cap insulating film 10 and the sidewalls 6 as a mask to form a pair of impurity diffusion layers 7 that will become a source and a drain. Thus, the access transistor having the gate electrode 5 and a pair of impurity diffusion layers 7 is complete.

Figure 1B:
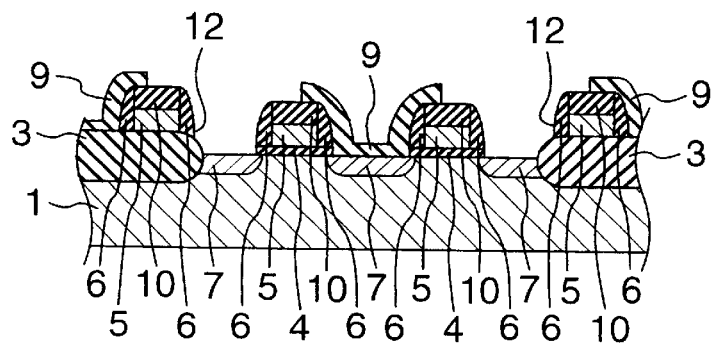

Then, as shown in FIG. 1B, a silicon oxide film is deposited on the entire surface of the substrate 1 including the field oxide film 3 by the CVD method to form an interlayer insulating film 9.

Successively, a bitline (not shown) that will give electrical conduction to one of the layers 7 (that will become the drain) of the access transistor is patterned onto the interlayer insulating film 9. Then, the film 9 is patterned by photolithography and subsequent dry etching to form a storage contact 12 that exposes part of the surface of the other layer 7 (that will become the source).

Figure 1C:
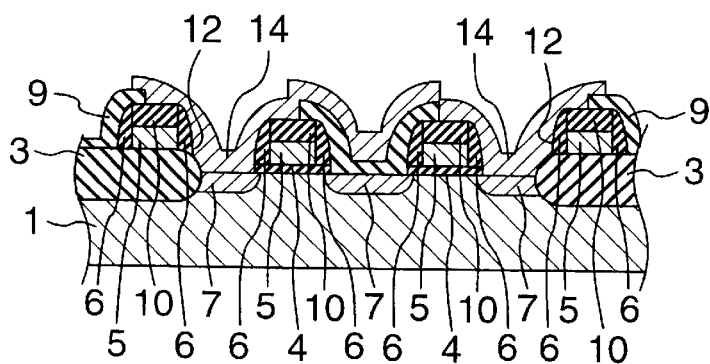

Then, as shown in FIG. 1C, a polysilicon film is formed to a thickness of about 50 nm so as to bury the storage contact 12. Then, the thus processed polysilicon film is patterned to form a storage node electrode 14 that is a lower electrode of the memory capacitor, the lower electrode being connected to the part of the layer 7, that serves as the source, within the storage contact 12.

Figure 1D:
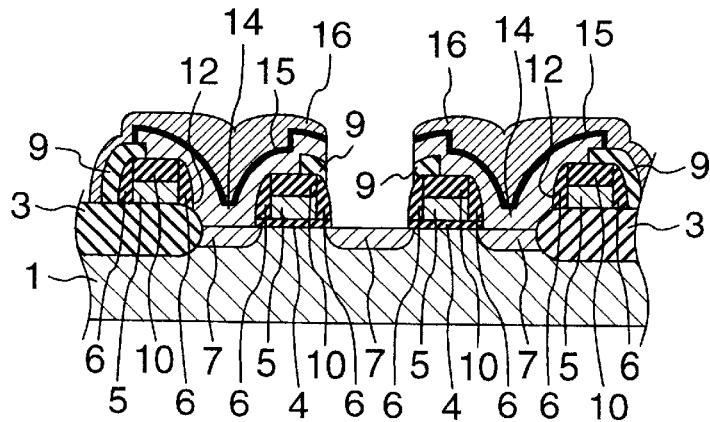

Successively, as shown in FIG. 1D, a capacitor insulating film 15 is formed so as to cover the surface of the storage node electrode 14, the film 15 being a three-layered ONO film formed by depositing an oxide film, a nitride film and an oxide film sequentially. Then, a polysilicon film is formed so as to cover the capacitor insulating film 15, and patterned to form a cell plate electrode 16 having a predetermined shape. The electrode 16 is an upper electrode of the memory capacitor. Thus, the memory capacitor in which the storage node electrode 14 is capacitively coupled with the cell plate electrode 16 through the capacitor insulating film 15 is complete.

Figure 1E:
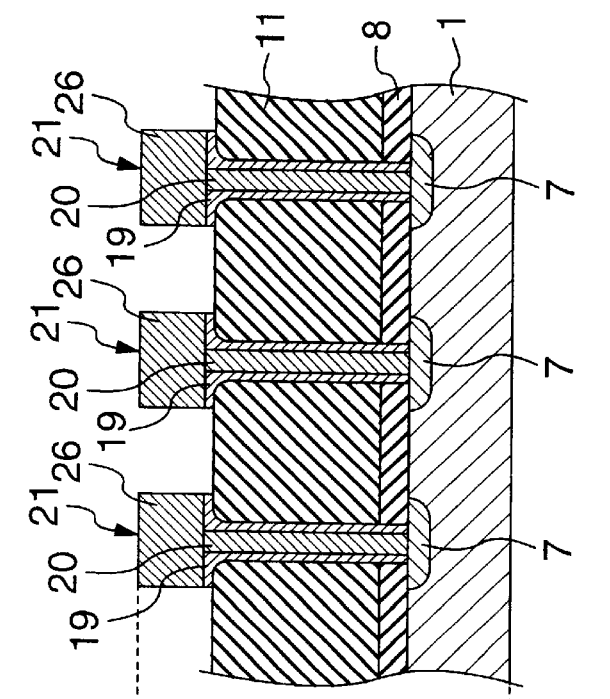

Then, as shown in the front view (a) and the side view (b) of FIG. 1E, an interlayer insulating film 8 is formed so as to cover the access transistor and the memory capacitor, and a planarizing interlayer insulating film 11 composed of borophospho silicate glass (BPSG) or the like is formed by the CVD method.

Successively, a contact hole 18 is formed in the films 8 and 11. The hole 18 is connected to the gate electrode 5 and the like of the access transistor. Then, an under layer film 19 composed of TiN is formed on the film 11 including the inner wall of the contact hole 18, and a tungsten film 20 is thereafter deposited thereon so as to bury the contact hole 18 through the film 19. Then, the tungsten film 20 is etched back so that all the film 20 excluding its portion buried in the contact hole 18 is removed. Thereafter, an aluminum film 26 is formed on the film 19, and the films 26 and 19 are patterned to form an interconnection wiring layer including a plurality of interconnection metal lines 21. Each interconnection metal line 21 is formed so that its thickness and width are on the order of 0.5 μm.

Figure 1F:
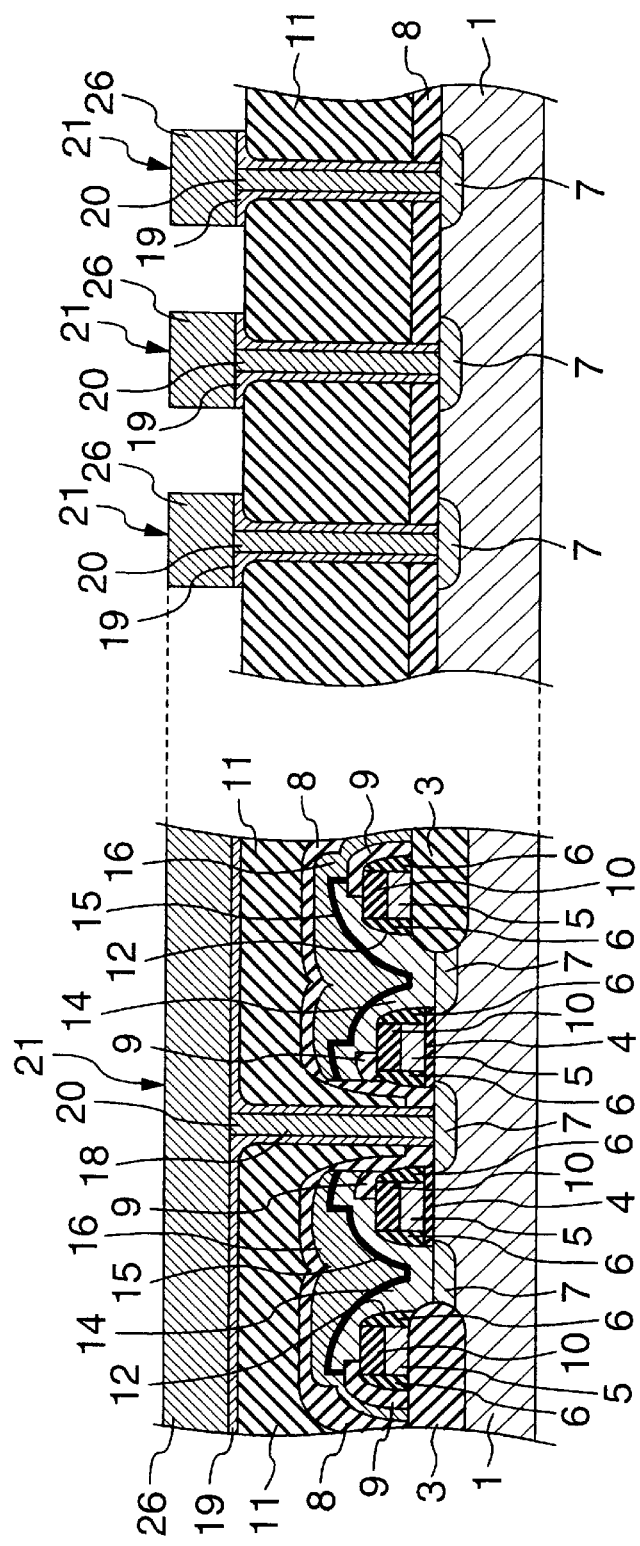
Figure 1F:
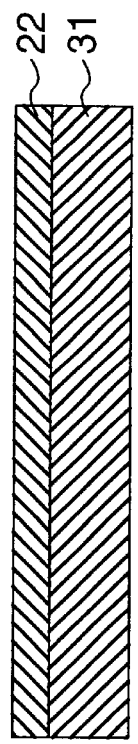
Figure 1G:
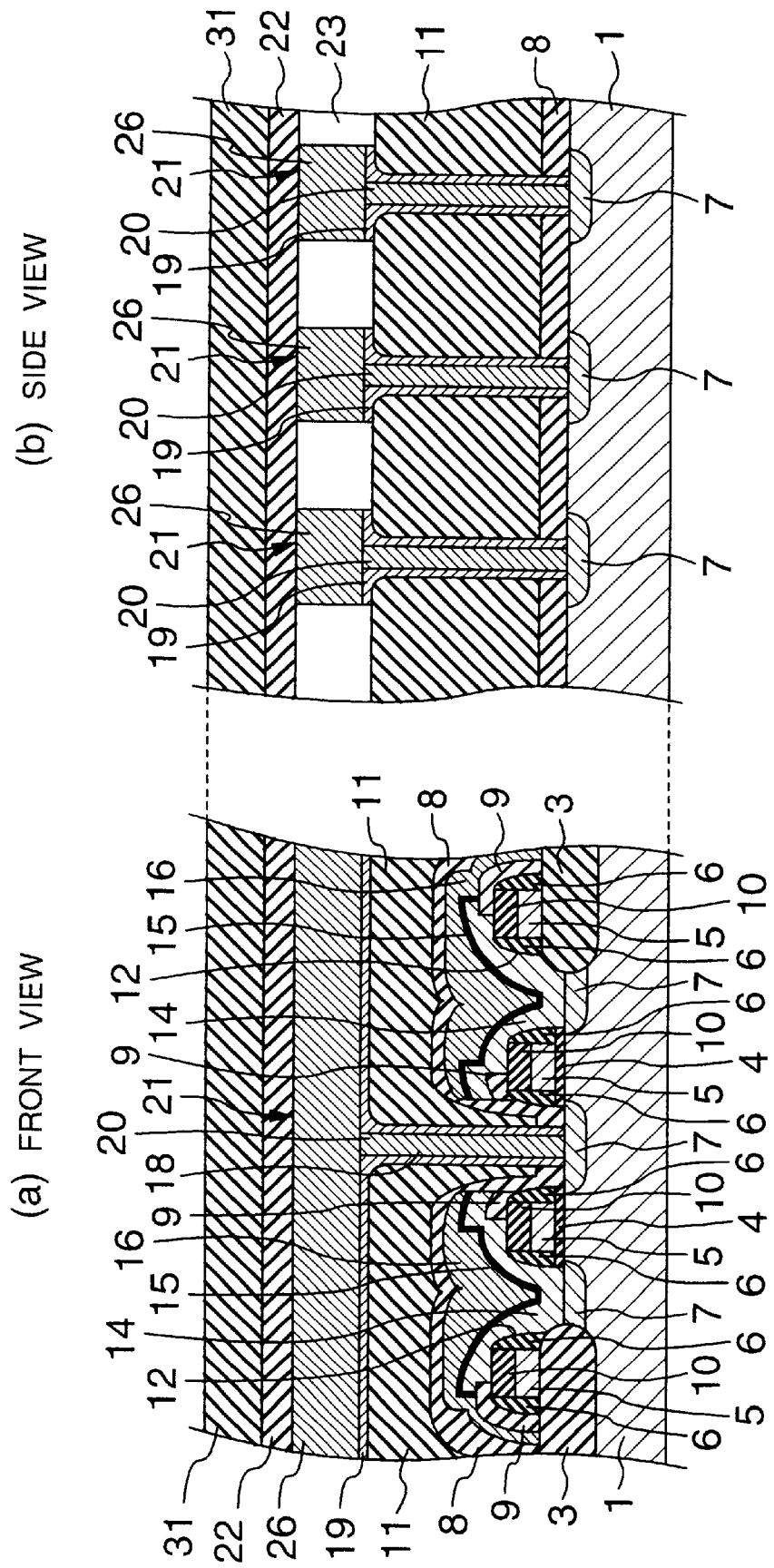
Figure 1H:
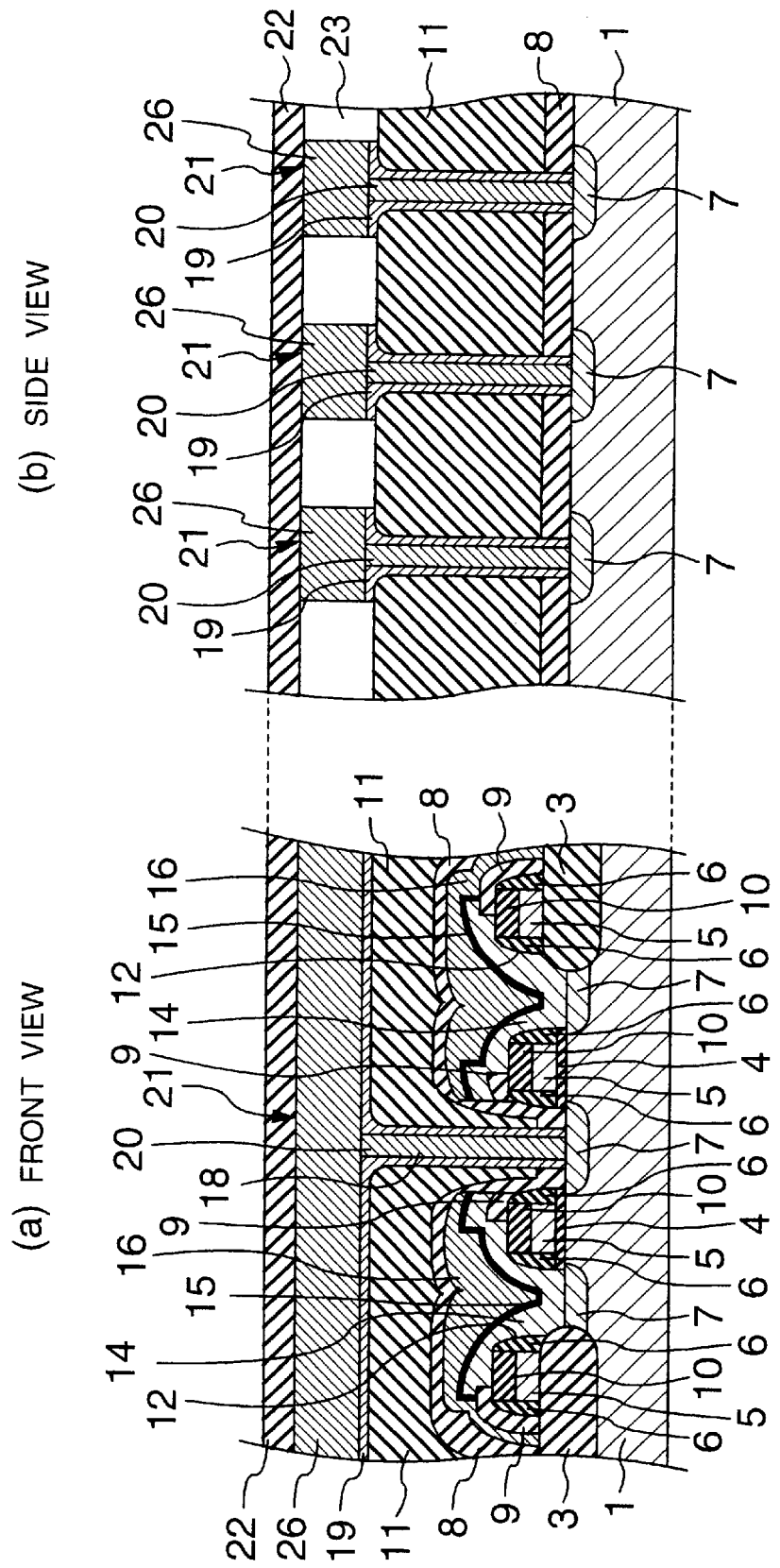

Then, as shown in FIG. 1F, a base film 31 composed of a fluorine-containing resin is prepared, and a silicon oxide film 22 is thereafter formed on the surface of the base film 31 by the CVD method to a thickness of about 300 nm. As shown in the front view (a) and the side view (b) of FIG. 1G, the film 22 is thermocompression-bonded onto the plurality of interconnection metal lines 21 using the base film 31 below which the film 22 is formed, and only the base film 31 is thereafter separated. At this point in the processing, since the base film 31 composed of the fluorine-containing resin has much smaller surface energy than a silicon oxide film 22, one can peel only the base film 31 off easily, leaving the film 22 deposited on the interconnection metal lines 21 so as to allow the film 22 to cover the upper surfaces of the interconnection metal lines 21. Thus, an air gap 23 is provided between the interconnection metal lines 21 as shown in the side view (b) of FIG. 1H. In this case, the surface of the adhered silicon oxide film 22 is substantially flat with almost no steps present thereon as shown in the front view (a) and the side view (b) of FIG. 1H. The thermocompression bonding process is carried out desirably at a low pressure, or more desirably under vacuum.

TEOS plasma silicon oxide films are particularly well adapted to be used as this silicon oxide film with its advantage of reliably producing high quality films. Further, instead of the silicon oxide film, a silicon nitride film, a BPSG film or the like may be formed on the surface of the base film 31 and adhered on the interconnection metal lines 21.

With respect to the planarization of insulating films, technology is disclosed in the extended abstracts for the 44th spring Meeting, 1997 of the Japan Society of Applied Physics and related societies by the title of "Novel Global Planarization Technology for Interlayer Dielectrics". This technology pertains to the formation and transfer of a flat SOG film and is named "STP (SOG transfer and hot-pressing) method."

Then, a silicon oxide film 24 is formed to a thickness of about 600 nm on the silicon oxide film 22 by the CVD method as shown in the front view (a) and the side view (b) of FIG. 1I. The film 24 is provided to ensure further planarization and satisfactory mechanical strengths. Thereafter, a highly heat-resistant silicon nitride film 25 is formed to a thickness of about 500 nm on the film 24 by the CVD method.

The DRAM is completed after going through the processes, although not shown in the drawings, of forming throughholes and interconnection layers, and of subsequently forming interlayer insulating films, the peripheral circuitry of a memory cell section (the peripheral circuitry is often formed together with the memory cell section sequentially) and the like.

Figure 2:
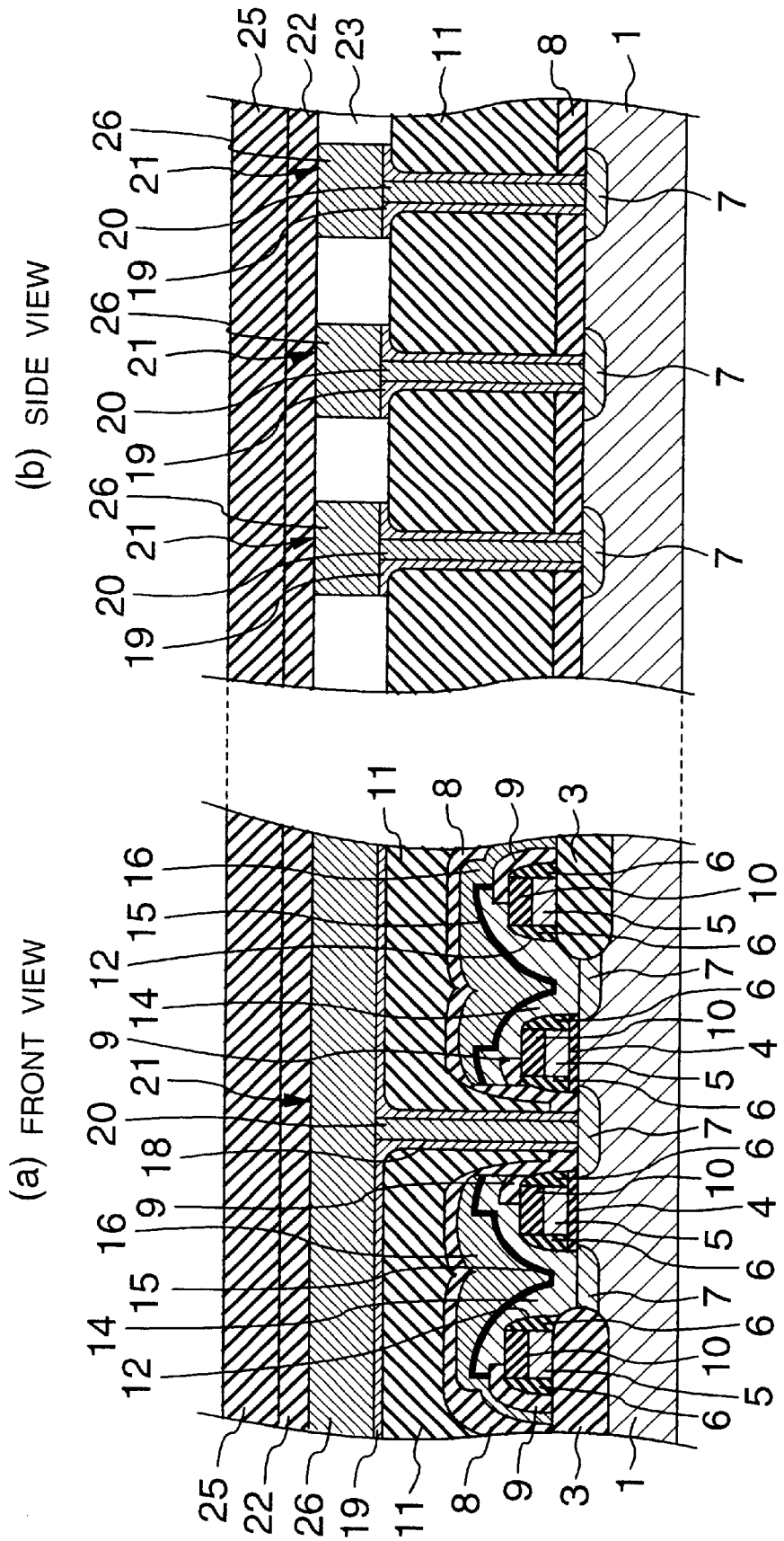

The silicon nitride film 25 may be deposited directly on the silicon oxide film 22, omitting the silicon oxide film 24. The front view (a) and side view (b) of FIG. 2 show this embodiment.

As described above, in these embodiments, the silicon oxide film 22 is adhered, by thermocompression-bonding, on the plurality of interconnection metal lines 21 patterned on the interlayer insulating film 11 using the base film 31 that has the first insulating film arranged on its surface. During the bonding, the film 22 is formed so as to cover only the upper surfaces of the interconnection metal lines 21, so that there is no likelihood that silicon oxides will enter into the space between the interconnection metal lines 21. As a result, the air gap 23 is provided between the adjacent interconnection metal lines 21. Since the film 22 is formed on the interconnections 21 by bonding, even if each interconnection 21 is miniaturized and has an extremely complicated shape, the air gap 23 is provided between the interconnection metal lines 21 easily as well as reliably, ensuring that the interconnection metal lines 21 are insulated from each other sufficiently.

SOG films conventionally used for insulation between interconnection wiring layers have a dielectric constant of about 2.8 to 3.5. If the SOG films are replaced with air having a dielectric constant of 1, parasitic capacitances can be reduced to values 0.28 to 0.35 times those in the conventional example.

Therefore, these embodiments can provide a highly reliable DRAM capable of high-speed operation and low power consumption by controlling parasitic capacitances between interconnections arranged accurately and adequately adjacent to each other, so that the DRAM can respond to the recent needs for further miniaturization and higher integration of DRAMs.

Further, the use of a silicon oxide film, a silicon nitride film or a BPSG film as the insulating film provides advantages such as increased heat resistance and reduced degassing, compared with the case where a polyimide film is used as the insulating film. Moreover, these films can be thinner than the polyimide film.

While the DRAMs of a COB (Capacitor Over Bitline) structure have been described in the aforementioned embodiments, the present invention can provide other types of DRAMs as well. For example, the invention can also be applied to DRAMs of a so-called CUB (Capacitor Under Bitline) structure in which a memory capacitor is formed substantially in layers below a bitline. Furthermore, the application of the invention is not limited to DRAMs but the invention can be applied to all types of semiconductor devices having upper interconnection wiring layers such as CMOS inverters and various types of semiconductor memories and to methods of fabricating such semiconductor devices.

The present invention can provide a highly reliable semiconductor device capable of high-speed operation by controlling parasitic capacitances between interconnections arranged accurately and adequately adjacent to each other, so that the semiconductor device can respond to the recent needs for further miniaturization and higher integration of semiconductor elements.

What is claimed is:

1. A semiconductor device comprising:
   a semiconductor substrate;
   a plurality of conductive films formed over the semiconductor substrate;
   a substantially non-porous an insulating film adhered onto the surface of said plurality of conductive films so as to form a substantially flat surface to cover said plurality of conductive films, a uniform air gap being provided between said plurality of conductive films so that the plurality of conductive films are insulated through the air gap; and
   a nitride film formed on the insulating film.

2. A semiconductor device according to claim 1, wherein:
   said insulating film includes a film selected from the group consisting of a silicon oxide film, a silicon nitride film, and a BPSG (boro-phospho silicate glass) film.

3. A semiconductor device according to claim 1, wherein:
   said nitride film is a silicon nitride film.

4. A semiconductor device according to claim 1, further comprising:
   a silicon oxide film formed between said insulating film and said nitride film.

5. A semiconductor device according to claim 1, further comprising:
   a semiconductor element arranged on said semiconductor substrate; and
   an interlayer insulating film formed over said semiconductor element;
   wherein said conductive films are formed on said interlayer insulating film so as to be connected to said semiconductor element.

6. A semiconductor device comprising:

a semiconductor substrate;

a plurality of conductive films formed over said semiconductor substrate;

a substantially non-porous insulating film adhered onto the upper surfaces of said plurality of conductive films forming a substantially flat surface so as to cover said plurality of conductive films, a uniform air gap being provided between said plurality of conductive films so that said plurality of conductive films are insulated through the air gap, said insulating film selected from the group consisting of a TEOS (tetra ethoxy silane) plasma silicon oxide film, a silicon nitride film and a BPSG (boro-phospho silicate glass) film.

7. A semiconductor device according to claim 6, further comprising:

a silicon nitride film formed on said insulating film.

8. A semiconductor device according to claim 7, further comprising:

a silicon oxide film formed between said insulating film and said silicon nitride film.

9. A semiconductor device according to claim 6, further comprising:

a semiconductor element arranged on said semiconductor substrate; and an interlayer insulating film formed over said semiconductor element;

wherein said conductive films are formed on said interlayer insulating film so as to be connected to said semiconductor element.

* * * * *